United States Patent
Allibert et al.

(10) Patent No.: US 9,443,933 B2
(45) Date of Patent: Sep. 13, 2016

(54) MATCHING OF TRANSISTORS

(71) Applicant: Commissariat à l'Energie Atomique et aux Energies Alternatives, Paris (FR)

(72) Inventors: Frédéric Allibert, Albany, NY (US); Maud Vinet, Albany, NY (US)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 0 days.

(21) Appl. No.: 14/421,298

(22) PCT Filed: Aug. 13, 2013

(86) PCT No.: PCT/EP2013/066930
§ 371 (c)(1),
(2) Date: Feb. 12, 2015

(87) PCT Pub. No.: WO2014/026996
PCT Pub. Date: Feb. 20, 2014

(65) Prior Publication Data
US 2015/0221723 A1    Aug. 6, 2015

(30) Foreign Application Priority Data
Aug. 13, 2012  (FR) ..................... 12 57792

(51) Int. Cl.
*G06F 17/50*    (2006.01)
*H01L 29/06*    (2006.01)
(Continued)

(52) U.S. Cl.
CPC ....... *H01L 29/0696* (2013.01); *G06F 17/5081* (2013.01); *H01L 21/823412* (2013.01); *H01L 27/0207* (2013.01); *H01L 27/085* (2013.01); *H01L 27/11* (2013.01); *H01L 27/1203* (2013.01)

(58) Field of Classification Search
CPC ................ H01L 29/0696; H01L 21/823412; H01L 27/11; H01L 27/085; H01L 27/0207; H01L 27/1203; G06F 17/5081
See application file for complete search history.

(56) References Cited

U.S. PATENT DOCUMENTS

2002/0084472 A1    7/2002  Marshall
2005/0199919 A1*   9/2005  Liu ................... H01L 29/66795
                                                       257/288

(Continued)

FOREIGN PATENT DOCUMENTS

EP    0348998 A1    1/1990

OTHER PUBLICATIONS

French Search Report for Application No. FR1257792 dated Mar. 13, 2013.
(Continued)

Primary Examiner — Nha Nguyen
(74) Attorney, Agent, or Firm — Lerner, David, Littenberg, Krumholz & Mentlik, LLP

(57) ABSTRACT

The present invention relates to a pair of transistors wherein each transistor of said transistor pair is made of several sub-transistors, and each sub-transistor of a transistor has a sub-transistor channel length and has a sub-transistor channel width, said sub-transistor channel length being substantially equal to the transistor channel length, and said sub-transistor channel width being smaller than the transistor channel width, so that the sum of the sub-transistor channel widths of the sub-transistors of a transistor is substantially equal to the channel width of said transistor, wherein each sub-transistor (43) of a transistor of said transistor pair is spaced apart from at least one adjoining sub-transistor (44) of the other transistor of said transistor pair by a distance D less than half the transistor channel width, said distance d between two sub-transistors (43, 44) being measured between the respective center of the channels of said sub-transistors.

12 Claims, 7 Drawing Sheets

(51) Int. Cl.
  H01L 27/02    (2006.01)
  H01L 27/085   (2006.01)
  H01L 27/12    (2006.01)
  H01L 21/8234  (2006.01)
  H01L 27/11    (2006.01)

(56) References Cited

U.S. PATENT DOCUMENTS

2008/0022247 A1*  1/2008  Kojima ............... G06F 17/5072
                                              257/401
2009/0091346 A1*  4/2009  Chuang ................ G11C 29/50
                                              324/762.09

OTHER PUBLICATIONS

Fujita K et al: "Advanced channel engineering achieving aggressive reduction of VT variation for ultra-low-power applications", Electron Devices Meeting (IEDM), 2011 IEEE International, IEEE, Dec. 5, 2011, pp. 32.3.1-32.3.4, XP032096049.

International Preliminary Report on Patentability for Application No. PCT/EP2013/066930 dated Oct. 20, 2014.

International Search Report for Application No. PCT/EP2013/066930 dated Oct. 21, 2013.

M. Vinet et al: "Variability in Fully Depleted MOSFETs", 2012 IEEE International Conference on IC Design & Technology, May 30, 2012, pp. 1-3, XP055056129.

Portmann L et al: "A high density integrated test matrix of MOS transistors for matching study", Microelectronic Test Structures, 1998. ICMTS 1998., Proceedings of the 1998 International Conference on Kanazawa, Japan Mar. 23-26, 1998, New York, NY, USA, IEEE, US, Mar. 23, 1998, pp. 19-24, XP010291081.

Weber 0 et al: "High immunity to threshold voltage variability in undoped ultra-thin FDSOI MOSFETs and its physical understanding", IEEE International Electron Devices Meeting, 2008: IEDM 2008 ; San Francisco, CA, USA, Dec. 15-17, 2008, IEEE, Piscataway, NJ, USA, Dec. 15, 2008, pp. 1-4, XP031434419.

* cited by examiner

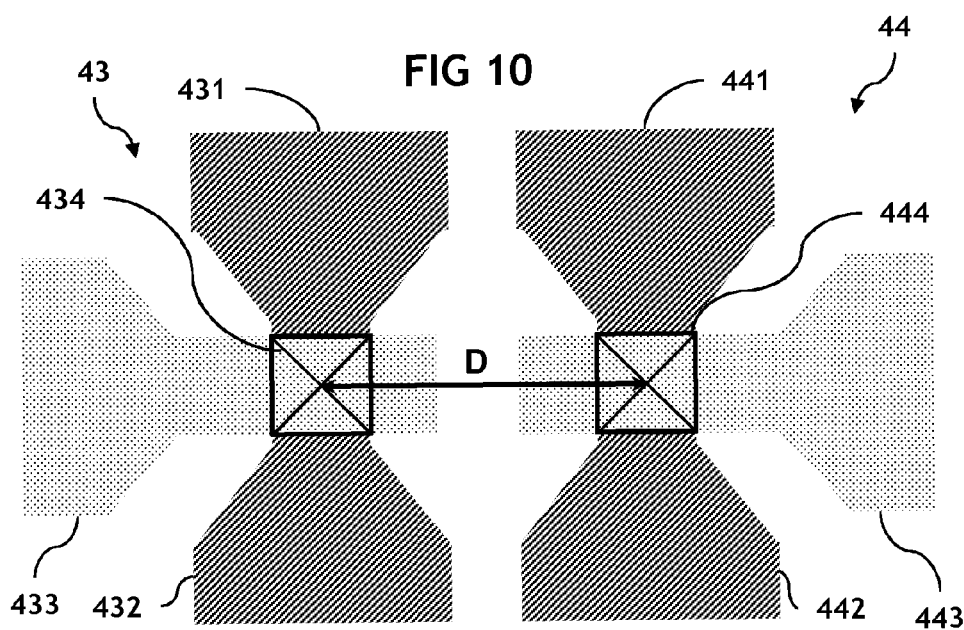
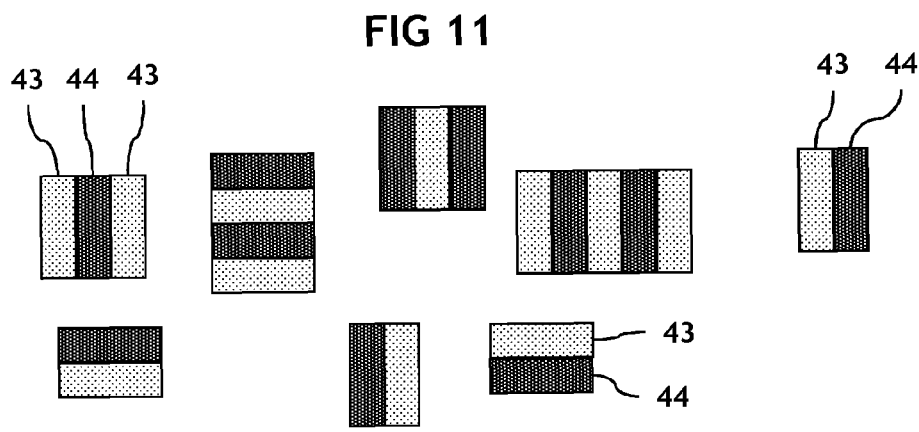
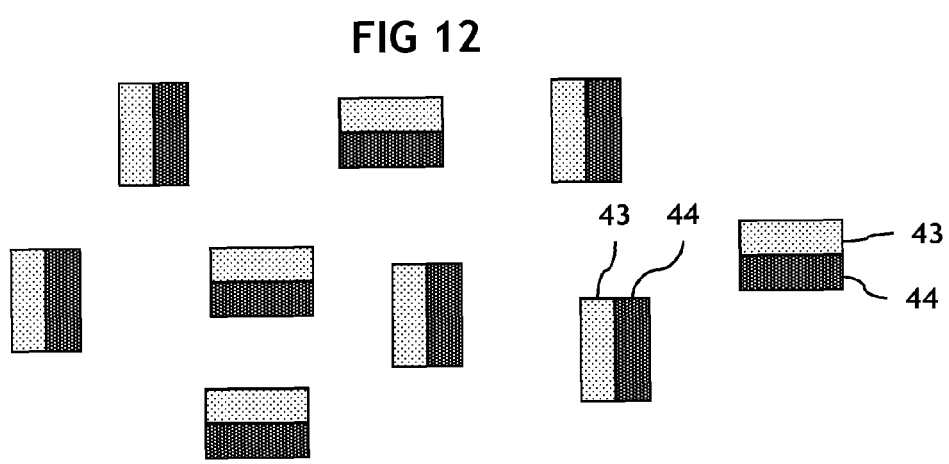

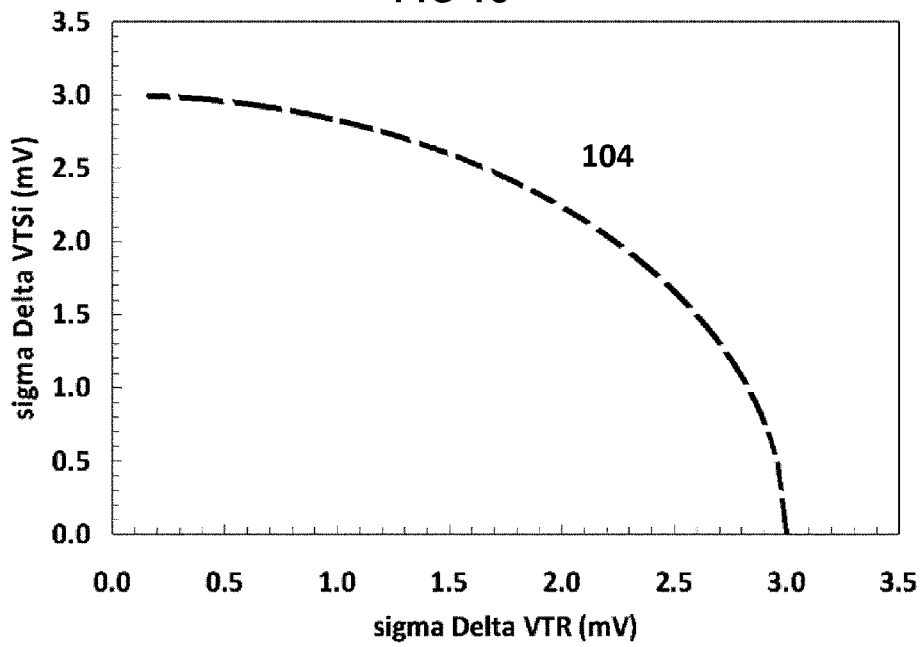
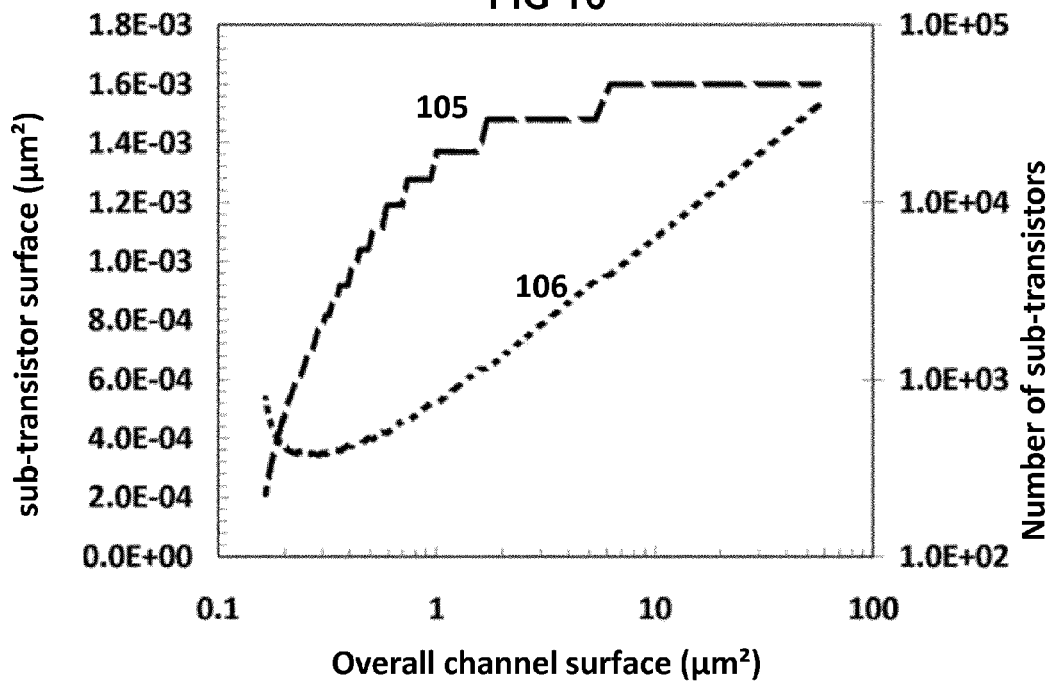

MATCHING OF TRANSISTORS

CROSS REFERENCE TO RELATED APPLICATIONS

The present application is a national phase entry under 35 U.S.C. §371 of International Application No. PCT/EP2013/066930, filed Aug. 13, 2013, published in English, which claims priority from French Patent Application No. 1257792 filed Aug. 13, 2012, all of which are hereby incorporated herein by reference.

BACKGROUND OF THE INVENTION

The present invention relates to a pair of MOS (metal-oxide-semiconductor) transistors, and a manufacturing method thereof. A MOS transistor, or MOSFET (for metal-oxide-semiconductor-field-effect-transistor) is an insulated-gate field-effect transistor in which the insulating layer between each gate terminal and the channel is oxide material.

Integrated circuits require using different types of transistors: short channel transistors for logic operations, small surface transistor for memories (SRAM) and large channel surface for analog transistors.

In an integrated circuit, transistors of the same type must have a low dispersion of their technical features. Requirement specification on this dispersion depends on the function of the transistors in the integrated circuit.

Typically, with analogic function such as current mirror, two transistors are supposed to have same electrical parameters. They are then called a pair of matched transistors.

A generally analyzed parameter to check the low dispersion between transistors of a pair is the threshold voltage difference between the two transistors of said pair, since variations between these threshold voltages cause efficiency fluctuations, increase electrical consumption, eventually decrease manufacturing efficiency and eventually threaten the circuit functionality.

For analog transistors, threshold voltage difference between matched transistors is typically desired to be less than 1 mV.

With bulk silicon technology, dispersion predominantly results from Random Dopant Fluctuation (RDF), which results from variation in the impurities (or dopants) concentration in the channel region of a MOSFET and can alter the properties of the transistor, especially the threshold voltage $V_T$.

Due to its randomness, this dispersion source tends to decrease as the transistor surface increases, due to averaging of dopant concentration.

Thus, when a person skilled in the art wants to have matched transistors, i.e. with substantially similar features, he uses transistors with large surfaces, i.e. whose channel surfaces are large. In particular, large surface transistors are used in pair for structures defining current references, current mirrors, or current comparator.

With the fully depleted silicon on insulator (FD-SOI) technology, transistors are built upon a thin layer of silicon over a Buried Oxide (commonly called BOx), said thin layer of silicon being undoped, or fully-depleted. Consequently, the predominance of Random Dopant Fluctuation as a dispersion source is suppressed.

A new source of dispersion is however introduced with respect to bulk silicon: channel silicon thickness $T_{Si}$ of transistor channel may substantially vary among transistors. Since threshold voltage $V_T$ depends on channel silicon thickness $T_{Si}$, variation of channel silicon thickness $T_{Si}$ causes variation of threshold voltage $V_T$.

FIG. 1 illustrates a sectional view of an SOI substrate to show an example of channel silicon thickness difference $\Delta T_{Si}$ between two transistors. A silicon layer 1 is built over a Buried Oxide layer 2. The channel silicon thickness $T_{Si}$ of said silicon layer 1 shows spatial variations due to the manufacturing process. The respective heights of surfaces 13 and 14 schematically represent the average channel silicon thickness under the corresponding top surfaces S13, S14 of the silicon layer covered by two transistor channels of a pair of transistors, respectively.

Accordingly, the height of the surface 13 represents the average channel silicon thickness under the surface S13 of a first transistor built on top of silicon layer 1, and arranged on the left-hand side of the pair in FIG. 1. The height of the surface 14 represents the average channel silicon thickness under the surface S14 of a second transistor built on top of silicon layer 1, and arranged on the right-hand side of the pair in FIG. 1.

For the sake of simplicity, depicted surfaces such as surfaces 13 and 14 will be assimilated to their respective transistors as a graphical way to represent the relation between channel surface and average channel silicon thickness for the transistors.

As seen on FIG. 1, average channel silicon thickness under the left-hand side transistor is less than average channel silicon thickness under the right-hand side transistor. This channel silicon thickness difference $\Delta T_{Si}$ causes variation of threshold voltage $V_T$ between the two transistors.

FIG. 2 shows that the distance between the respective centers of transistors is important. As depicted on FIG. 2, left-hand side transistor 13 can be paired with a first transistor 14a in its vicinity, at a short distance Da. The resulting channel silicon thickness difference $\Delta T_{Si}1$ is relatively low. Should this left-hand side transistor 13 be paired with a second transistor 14b instead of the first transistor 14a, said second transistor being arranged at a greater distance Db from transistor 13, the resulting channel silicon thickness difference $\Delta T_{Si}2$ can be much greater.

For smaller transistors, i.e. with a small surface channel, threshold voltage $V_T$ variations induced by channel silicon thickness differences are not the predominant sources of dispersion. Indeed, random sources of dispersion such as Random Dopant Fluctuation (RDF) have a greater effect on the electrical parameters of the transistors.

This side effect is however especially detrimental for large surface transistors, i.e. with a large surface channel. Because they cover a large surface, the average channel silicon thicknesses of two transistors can significantly differ.

FIG. 3 illustrates a configuration similar to FIG. 1 with larger surface transistors. Due to greater spatial extension of the transistors, the channel silicon thickness difference $\Delta T_{Si}$ between the two transistors 23, 24 is increased.

In FIG. 4, an even greater spatial extension, i.e. channel surface, of the transistors 33, 34 results in greater channel silicon thickness difference $\Delta T_{Si}$.

It shall be noted that this is the same with any technology wherein the substrate has a buried interface which delimits the active region thickness of the channel of transistors. The buried interface is a change of material which confines the charge carriers contributing to the conduction (e.g. electrons for N-MOS transistors or holes for P-MOS transistors) in the active region. Delimiting the active region depth of the channel means that the active region may not extend beyond said interface, due to differences in electrical characteristics between the material under said buried interface and the substrate.

For example, the buried interface may be an interface between the silicon of the channel and an insulating substrate or an interface between the silicon of the channel and a buried layer distinct from the substrate. Said buried interface also defines the channel silicon thickness of the transistor. Such thicknesses consideration will be referred to as channel silicon thickness in the following description. Preferably, the active region has a thickness under 15 nm.

Preferably, the active region is fully depleted in the depletion region, i.e. with a doping concentration substantially equals to or inferior to $10^{17}$ cm$^{-3}$ for the depletion region, for example 3 nm under the gate oxide, and under $10^{18}$ cm$^{-3}$ for the whole active region.

The buried interface can thus be defined by an insulating layer such as in the Silicon-on-Insulator technology, and the active region is then the thin film of silicon above the insulating layer. An exemplary embodiment uses the FD-SOI technology, and the buried interface is then the interface between the Box and the thin silicon film.

Besides FD-SOI, it can be a bulk silicon substrate wherein a silicon film constituting the channel is isolated by a strongly doped silicon layer, e.g. dopant concentration beyond $10^{18}$ cm$^{-3}$ or $10^{19}$ cm$^{-3}$.

The following description will be made with reference to FD-SOI transistors as a non-limitative example.

SUMMARY OF THE INVENTION

An object of the present invention is providing a pair of transistors wherein the electric characteristics of the transistors are matched, and the manufacturing method for producing them.

To achieve this object, the invention proposes according to a first aspect a pair of transistors on a substrate having a buried interface which delimits the active region thickness of the channel of said transistors, said transistors having each:
  a transistor channel length $L_G$,
  a transistor channel width $W_G$,
  a transistor channel surface S, said transistor channel surface S being greater than or equal to 0.5 µm$^2$,
  wherein each transistor of said transistor pair is made of several sub-transistors,
  wherein each sub-transistor of a transistor has a sub-transistor channel length $L_i$ and has a sub-transistor channel width $W_i$, said sub-transistor channel length $L_i$ being substantially equal to the transistor channel length $L_G$, and said sub-transistor channel width $W_i$ being smaller than the transistor channel width $W_G$, so that the sum of the sub-transistor channel widths $W_i$ of the sub-transistors of a transistor is substantially equal to the channel width $W_G$ of said transistor,
  wherein each sub-transistor of a transistor of said transistor pair is spaced apart from at least one adjoining sub-transistor of the other transistor of said transistor pair by a distance D less than half the transistor channel width $W_G$, said distance D between two sub-transistors being measured between the respective center of the channels of said sub-transistors, said sub-transistor of a transistor and said adjoining sub-transistor of the other transistor being aligned in the direction of their widths;

Exemplary embodiments of a pair of transistor according to the invention will be described hereafter with reference to the appended figures; the description and the figures also showing additional features which are also part of the invention, among which:
  said distance D is less than 1 µm, preferably less than 0.1 µm;
  said distance D is less $W_G/4$, preferably less than $W_G/10$;
  each transistor of said transistor pair comprising at least 3 sub-transistors, preferably at least 10 sub-transistors, more preferably 100 sub-transistors;
  said transistor channel length $L_G$ is greater than or equal to 0.25 µm, preferably greater than or equal to 0.5 µm;
  said transistor channel surface S is greater than or equal to 2 µm$^2$, preferably greater than or equal to 5 µm$^2$;
  the substrate is a silicon-on-insulator substrate;
  the substrate is a bulk substrate wherein a silicon film constituting the channel is isolated with a doped layer;
  the two transistors of the transistor pair are made of the same number of sub-transistors;
  the sub-transistors have the same width $W_i$.

The invention also concerns an integrated circuit having at least one pair of transistors according to the invention.

According to another aspect of the invention, a method is provided for manufacturing pairs of transistors according to the first aspect, i.e. a pair of transistors on a substrate having a buried interface which delimits the active region thickness of the channel of said transistors, said transistor pairs having:
  a random threshold voltage variability $\sigma_{\Delta VTR}$ which depends on the channel surface of the transistors,
  a channel silicon thickness induced threshold voltage variability $\sigma_{\Delta VTsi}$
which depends on the transistors respective location on the substrate,
wherein each transistor of a transistor pair is made of several sub-transistors,
and each of the sub-transistors of a transistor adjoining a sub-transistor of the other transistor of said transistor pair so that the transistors respective location depends on the number of sub-transistors, the method comprises the following steps:
  a) defining a desired overall threshold voltage variability $\sigma_{\Delta VT}$,
  b) determining values of random threshold voltage variability $\sigma_{\Delta VTR}$ and channel silicon thickness induced threshold voltage variability $\sigma_{\Delta VTsi}$ permitting said desired overall threshold voltage variability $\sigma_{\Delta VT}$ to be achieved,
  c) determining values of overall transistor channel surfaces and sub-transistor channel surfaces permitting to obtain the values determined at step b),
  d) determining the numbers of sub-transistors required to achieve the values determined at step c),
  e) selecting a number of sub-transistors close to the minimum of required sub-transistors, thereby determining the corresponding value of the total transistor surface.

BRIEF DESCRIPTION OF THE DRAWINGS

Other aspects, objects and advantages of the invention will become better apparent upon reading the following description of embodiments of the invention as non-limiting examples, made with reference to the appended drawings wherein:

FIG. 10 illustrates the distance D between the respective centers of channels of adjoining sub-transistors;

FIGS. 11 and 12 illustrate possible arrangements of sub-transistors;

FIG. 12-16 illustrates curves used for determining the number of sub-transistors.

DETAILED DESCRIPTION

Figure 1:
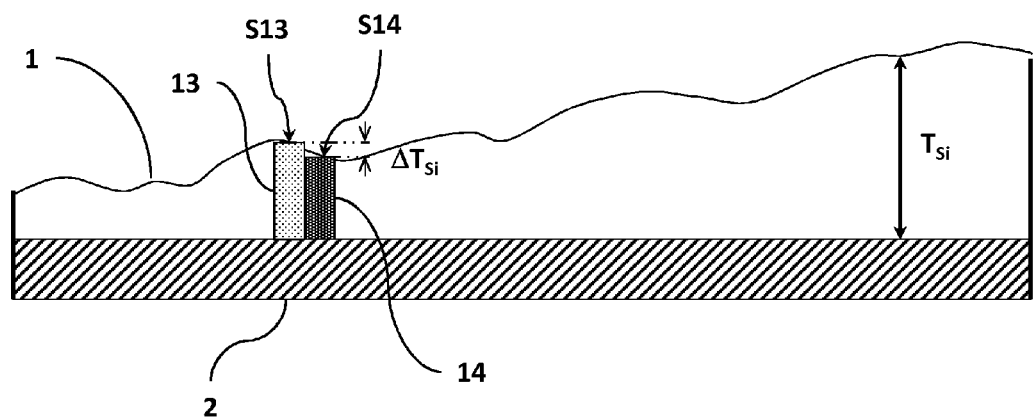
FIG. 1-4 illustrate sectional views of an SOI substrate to show examples of channel silicon thickness differences $\Delta T_{Si}$ between two transistors.
Figure 2:
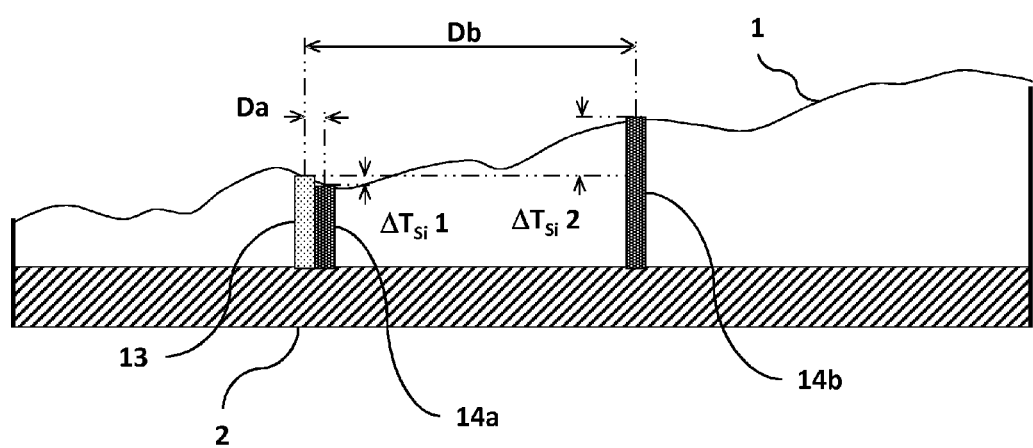
Figure 3:
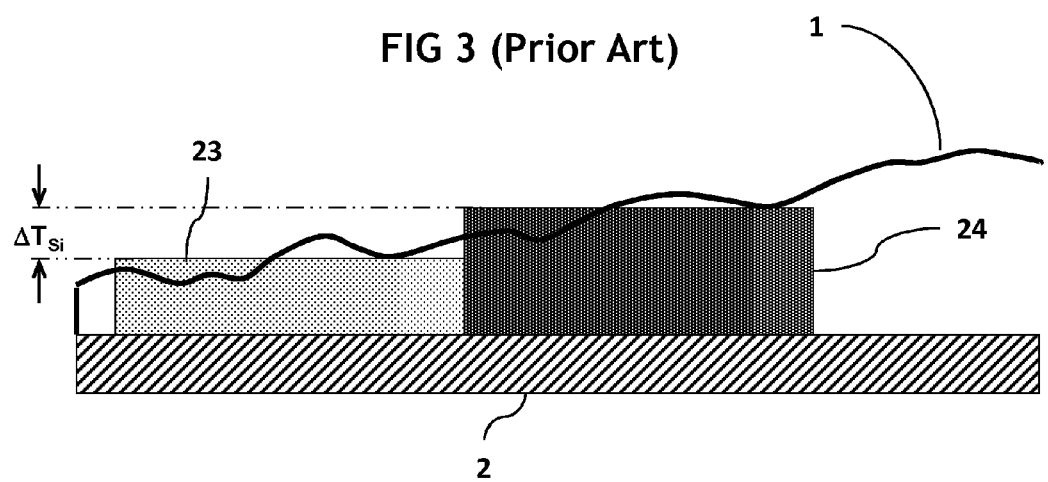

Channel silicon thickness variation is not entirely random. Respective thicknesses of two remote points are likely to be more different than respective thicknesses of two neighboring points. In other words, the more spaced apart the devices, the higher the silicon channel thickness statistical difference between them is. This can be seen with the large surface transistors of FIGS. 3 and 4.

The invention provides a pair of transistors on a substrate having a buried interface which delimits the active region thickness of the channel of said transistors, said transistors having each:
- a transistor channel length $L_G$,
- a transistor channel width $W_G$,
- a transistor channel surface S, said transistor channel surface S being greater than or equal to 0.5 µm².

The transistor channel surface S is equal to the product of the transistor channel length $L_G$ and the transistor channel width $W_G$, so $S=W_G \times L_G$.

According to the invention, each transistor of a transistor pair is made of several interconnected sub-transistors. In other words, all the gates of the sub-transistors of a transistor are electrically connected together, all the sources of the sub-transistors of a transistor are electrically connected together, and all the drains of the sub-transistors of a transistor are electrically connected together. Accordingly, the interconnected sub-transistors thus behave like the corresponding large transistor.

These sub-transistors are arranged so that the average channel silicon thickness difference $\Delta T_{Si}$ between the two transistors is minimized. The threshold voltages of the two transistors of said pair thus become substantially equal because of the minimization of the dispersion due to channel silicon thickness $T_{Si}$. Further, by keeping a large overall channel surface, the random sources of dispersion are still averaged.

Figure 4:
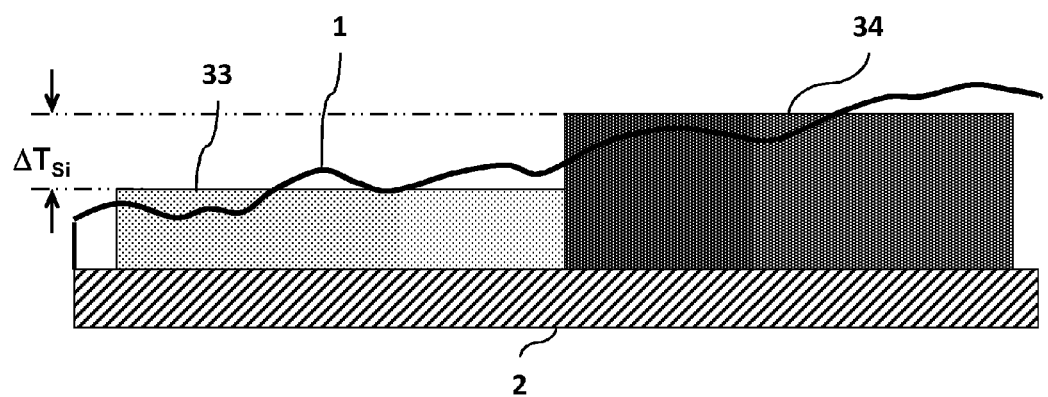
Figure 5:
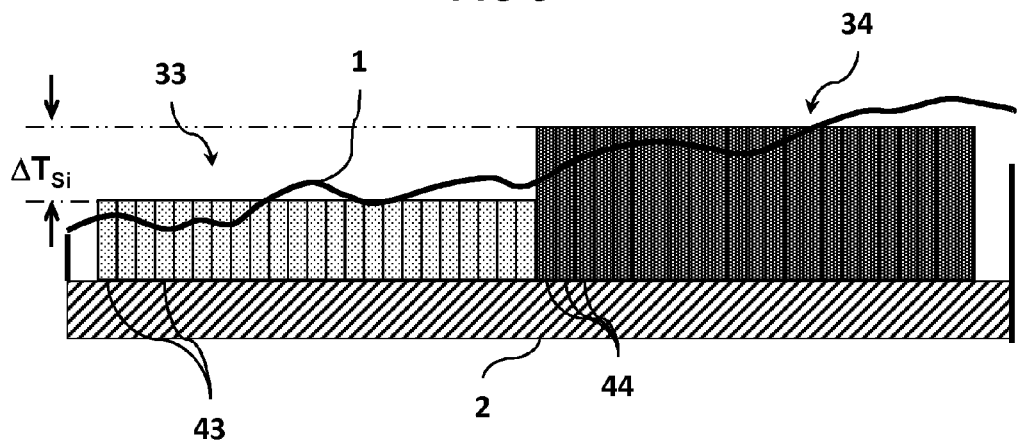
FIG. 5-6 illustrate sectional views similar to FIG. 1-4, wherein the transistors are divided into sub-transistors.

FIG. 5 shows that the transistors 33 and 34 of FIG. 4 can be made of several sub-transistors. Both transistors 33 and 34 of the pair has a long channel length, typically greater than or equal to 0.25 nm, preferably greater than or equal to 50 nm, and more preferably greater than or equal to 100 nm. A long channel minimizes current leakages.

The transistors 33, 34 have the same transistor channel length $L_G$, said transistor channel length $L_G$ being greater than or equal to 0.25 µm, the same transistor channel width $W_G$, said transistor channel width $W_G$ being greater than or equal to 0.5 µm, and the same channel surface S, said transistor channel surface S being greater than or equal to 0.5 µm².

Each of the transistors 33 and 34 are made of several sub-transistors, namely made of sub-transistors 43 for the transistor 33 and made of sub-transistors 44 for the transistor 34.

Each sub-transistor of a transistor has a sub-transistor channel length $L_i$ and has a sub-transistor channel width $W_i$. Said sub-transistor channel length $L_i$ is substantially equal to the transistor channel length $L_G$ of said transistor.

Said sub-transistor channel width $W_i$ is smaller than the transistor channel width $W_G$ of said transistor, so that the sum of the sub-transistor channel widths $W_i$ of the sub-transistors of a transistor is substantially equal to the channel width $W_G$ of said transistor. Accordingly, if N is the number of sub-transistors:

$$\sum_{i=1}^{N} W_i \approx W_G$$

The sub-transistor channel width $W_i$ is also smaller than the transistor channel length $L_g$. As a consequence, since the sub-transistor channel length $L_i$ is substantially equal to the transistor channel length $L_G$ of said transistor, the sub-transistor channel width $W_i$ is also smaller than the sub-transistor channel length $L_i$.

The configuration shown on FIG. 5 does not substantially change the electric characteristics of the transistors 33 and 34, since the channel silicon thickness difference $\Delta T_{Si}$ is unchanged.

Figure 6:
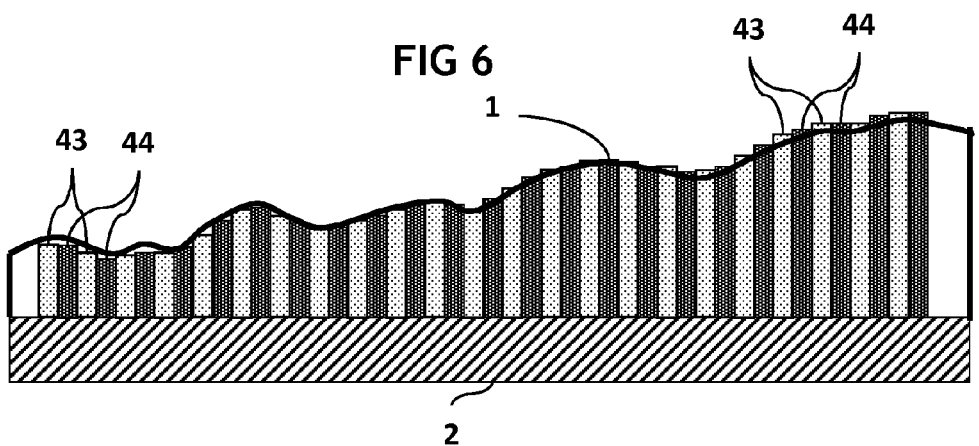

FIG. 6 however illustrates the same sub-transistors 43, 44 rearranged in order to spatially alternate a sub-transistor of a transistor with a sub-transistor of the other transistor. Accordingly, any sub-transistor 43 of the transistor 33 is adjoining two sub-transistors of the other transistor 34.

Since each sub-transistor of a transistor of said transistor pair is near at least one adjoining sub-transistor of the other transistor of said transistor pair, the channel silicon thickness difference between said sub-transistors is statistically minimized since the thickness variation between close points is more likely to be smaller than for points which are remote from each other.

For each sub-transistor 43, 44, there is a sub-transistor of the other transistor which is spatially close and have a similar channel silicon thickness. Since the channel silicon thickness difference $\Delta T_{Si}$ between the two transistors is the sum of the thickness difference between their respective sub-transistors, the channel silicon thickness difference $\Delta T_{Si}$ between the two transistors is also statistically minimized. Accordingly, the threshold voltage difference due to the channel silicon thickness difference is also statistically minimized.

Figure 7:
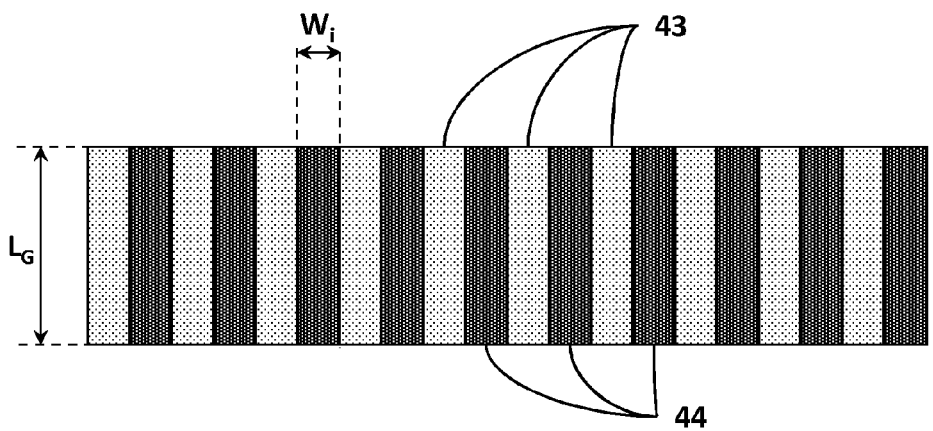
FIG. 7 illustrates a top view of the arrangement of the sub-transistors whose channel silicon thickness is illustrated in FIG. 6.

FIG. 7 illustrates a top view of the arrangement of the sub-transistors 43 and 44 whose channel silicon thickness is illustrated in FIG. 6. The sub-transistors are aligned in the direction of their widths, and accordingly, a sub-transistor of a transistor and the adjoining sub-transistor of the other transistor are aligned in the direction of their channel widths.

Figure 8:
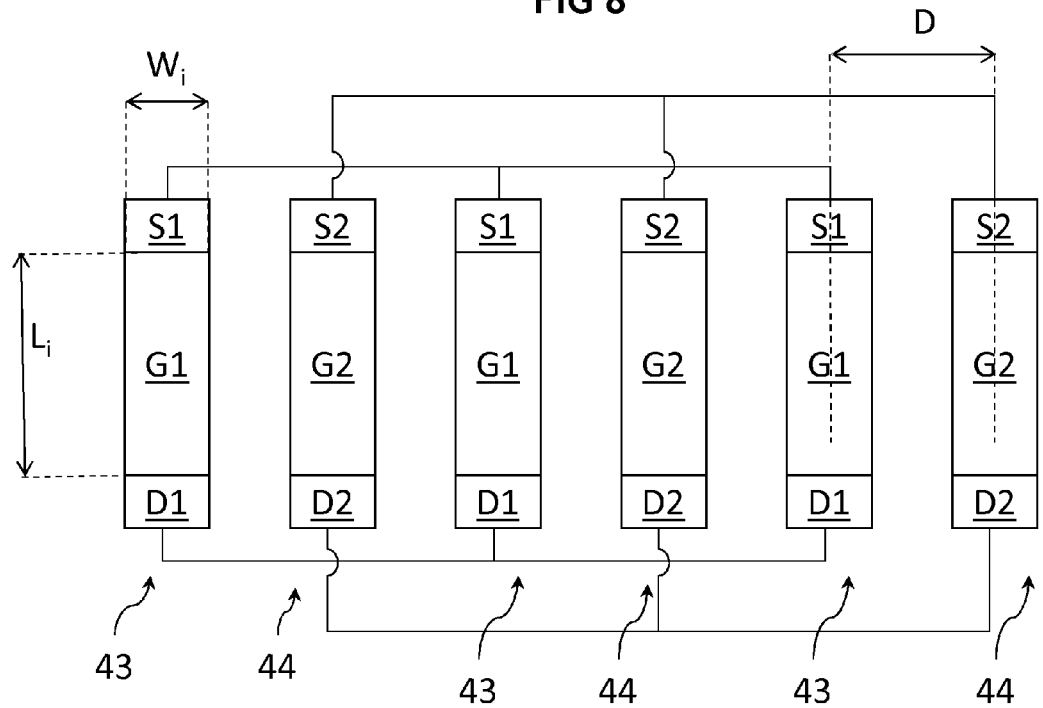
FIGS. 8 and 9 illustrate possible arrangements of sub-transistors of a pair of transistors.

FIG. 8 illustrates a possible configuration for the arrangement of sub-transistors 43, 44 of a pair of transistors. Each sub-transistor 43 of the first transistors of the pair comprises a source S1, a drain D1, and a gate G1. The sources S1 of the sub-transistors 43 of the first transistor of the pair are connected together. The drains D1 of the sub-transistors 43 of the first transistor of the pair are connected together. The gates G1 of the sub-transistors 43 of the first transistor of the pair are connected together, although such connection is not shown in FIG. 8.

Each sub-transistor 44 of the second transistors of the pair comprises a source S2, a drain D2, and a gate G2. The sources S2 of the sub-transistors 44 of the second transistor of the pair are connected together. The drains D2 of the sub-transistors 44 of the second transistor of the pair are connected together. The gates G2 of the sub-transistors 44 of the second transistor of the pair are connected together, although such connection is not shown in FIG. 8.

The sub-transistors 43, 44 are aligned in the direction of their channel width. Since the channel width $W_i$ of the sub-transistors 43, 44 is shorter than their channel length $L_i$, aligning them in the direction of their channel width allows the channel center of two adjoining sub-transistors to be closer. Preferably however, in order to keep a good electrical insulation between them, the channels are spaced apart by a distance of a least 30~50 nm.

The sub-transistors 43 of the first transistor and the sub-transistors 44 of the second transistor are interleaved so that each sub-transistor of a transistor of the transistor pair is adjacent to a sub-transistor of the other transistor of the pair.

The sub-transistors 43, 44 are arranged so that the channel of a sub-transistor of a transistor of the pair is adjacent to the channel of a sub-transistor of the other transistors, without any source or drain between them.

Figure 9:
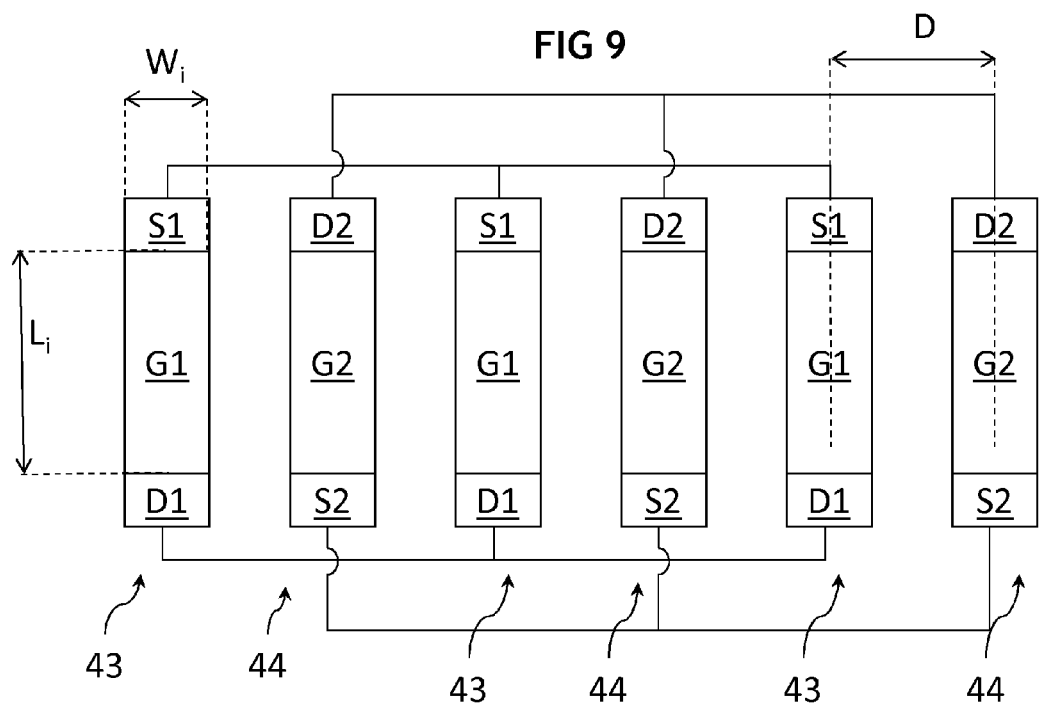

In FIG. 8, the sub-transistors 43, 44 have the same orientation, i.e. their drains D1, D2 (or sources S1, S2) are on the same side. This is not compulsory, as shown by FIG. 9, wherein the sub-transistors 43 of the first transistor of the pair are oriented oppositely to the sub-transistors 44 of the second transistor of the pair. In other words, the sources S1 of the sub-transistors 43 of the first transistor of the pair are on the same side as the drains D2 of the sub-transistors 44 of the second transistor of the pair, and the drains D1 of the sub-transistors 43 of the first transistor of the pair are on the same side as the sources S2 of the sub-transistors 44 of the second transistor of the pair.

The most important point is the short distance between two sub-transistors of different transistors. Each sub-transistor of a transistor of the transistor pair is spaced apart from at least one adjoining sub-transistor of the other transistor of the transistor pair by a distance D less than half the transistor channel width $W_G$, said distance D between two sub-transistors being measured between the respective center of the channels of said sub-transistors.

FIG. 10 illustrates the distance D between the respective centers of channels of adjoining sub-transistors 43, 44. Each sub-transistor comprises a source 431, 441, a drain 432, 442, and a gate 433, 443. The channel 434, 444 is defined as the active region covered by the gate 433, 443 between the source and drain. The distance D is the spatial distance between the respective spatial centers of said channel 434, 444 (in the same plane).

Distance D should be as small as possible. At least, D is less than half the transistor channel width $W_G$, but preferably $D \leq W_G/4$, more preferably $D \leq W_G/10$.

For example, $D \leq 1$ μm, more preferably $D \leq 0.1$ μm. Smaller distances can be chosen, for example, for 14 nm node technology, a distance D of 64 nm, corresponding to the contacted pitch of this technology node.

With a short distance D, channel silicon thickness variation affecting a sub-transistor of a transistor affects similarly at least one sub-transistor of the other transistor. Therefore both transistors of the pair are affected similarly by channel silicon thickness variations.

This distance D should be as small as possible. Therefore, any sub-transistors of a transistor and the adjoining sub-transistor of the other transistor are preferably aligned in the direction of their widths, as shown in FIGS. 7-12, in order to minimize the distance D.

There is no need for all the sub-transistors to be aligned along the same line. As shown in FIGS. 11 and 12, the sub-transistors can be distributed on the substrate, provided that each sub-transistor of a transistor of the transistor pair is close to at least one adjoining sub-transistor of the other transistor of the transistor pair. Different orientations of the paired sub-transistors can be chosen, for example with some of them perpendicular to others.

Preferably, the sub-transistors are formed in groups with the same number of sub-transistors of each transistor. As shown in FIG. 12, sub-transistors of a transistor are paired with a sub-transistor of the other transistor. Accordingly, channel silicon thickness variation affecting a sub-transistor of a transistor affects similarly one sub-transistor of the other transistor, thereby equalizing the channel silicon thicknesses between transistors.

Dividing the transistors 33, 34 in sub-transistors thus allows for a better matching of their characteristics. Preferably, each transistor is made of at least 3 sub-transistors, preferably at least 10 sub-transistors, more preferably at least 100 sub-transistors.

The transistors of the pair are not necessarily made of the same number of sub-transistors, but having the same number of sub-transistors facilitates their arrangement design and provides better result with respect to channel silicon thickness difference minimization. Accordingly, the two transistors of the transistor pair are preferably made of the same number of sub-transistors Sub-transistors can have different widths $W_i$ but having the same width $W_i$ for sub-transistors facilitates their arrangement design and provides better result with respect to channel silicon thickness difference minimization. Accordingly, the sub-transistors preferably have the same width $W_i$.

According to the invention, lower threshold voltage variability can be obtained. Threshold voltage variability in a transistor is the statistical sum of the random and non-random components of this threshold voltage variability. Random components comprise for example the Random Dopant Fluctuation (RDF), which results from variation in the impurity (or dopant) concentration in the channel region of a MOSFET, the Line Edge Roughness fluctuation, affecting channel width and length and the fluctuations of work function in the gate stack.

Random components affecting the threshold voltage will be denoted $\sigma V_{TR}$, with the random variability between two transistors being denoted $\sigma \Delta V_{TR}$. Due to their randomness, these random components are averaged with the use of large transistors. The random part of variability is thus reduced with larger transistors. According to the invention, transistors thus have a surface larger than 0.5 μm², preferably 2 μm², and more preferably 5 μm² or 10 μm².

With an FD-SOI transistor, the channel is lightly doped, i.e. less than about $10^{17}$ cm$^{-3}$, in the inversion zone, typically within 3 nm under the gate oxide. Accordingly, random dopant fluctuations are negligible. However, as explained above, channel silicon thickness fluctuation can alter transistor matching. Let threshold voltage variability due to channel silicon thickness be denoted $\sigma\Delta V_{TSi}$, and random variability between two paired transistors be denoted $\sigma\Delta V_{TR}$.

Overall variability of the threshold voltages between two transistors is then:

$$\sigma_{\Delta V_T} = \sqrt{\sigma_{\Delta V_{TSi}}^2 + \sigma_{\Delta V_{TR}}^2} \qquad (1)$$

with $\sigma\Delta V_{TSi}$ being a function of the channel silicon thickness variability $\sigma T_{Si}$ and of the sensitivity of the threshold voltage $V_T$ to channel silicon thickness variation $(dV_T/dT_{Si})$.

Channel silicon thickness fluctuation as a function of the distance X between two locations can be determined from thickness measurement data. Fourier transform of the channel silicon thickness measurements with respect to the location provides the power spectral density (PSD). Integration of this power spectral density on the spatial frequency-domain $[X^{-1}; \infty[$ provides the average thickness variation $\sigma T_{Si}$.

As a transistor pair is considered, X can be approximately interpreted as the size of a transistor, possibly completed with the distance between two transistors.

Figure 13:
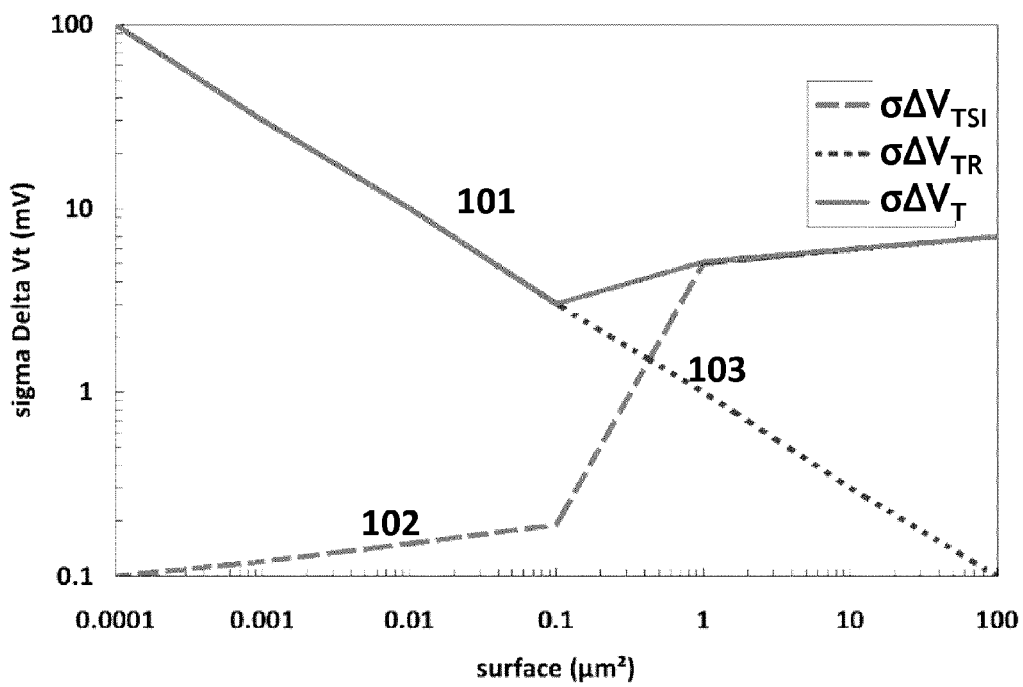

As a non-limiting example, the graph of FIG. 13 illustrates curves representing, as a function of the transistor surface in a logarithmic scale, possible values of threshold voltage overall variability $\sigma\Delta V_T$ (solid line 101) and its main components, i.e. channel silicon thickness induced variability $\sigma\Delta V_{TSi}$ (dashed line 102) and random variability $\sigma\Delta V_{TR}$ (dotted line 103). FIG. 13 is a simplified model used to illustrate the principles of the invention.

As can be seen on FIG. 13, random threshold voltage variability $\sigma\Delta V_{TR}$ decreases as transistor surface increases, and for transistor surface larger than 0.1 µm², channel silicon thickness induced variability $\sigma V_{TSi}$ cannot be ignored.

According to the invention, each transistor of the transistor pair, having a large channel surface, a channel length $L_G$ and a channel width $W_G$, is divided into n smaller transistors, i.e. sub-transistors, preferably having the same length L and having a width equals to W/n. The sub-transistors of a transistor are then interleaved or mixed with sub-transistors of the other transistor of said pair.

The terminals of the sub-transistors of a transistor are interconnected. In other words, all the gates of the sub-transistors of a transistor are electrically connected together, all the sources of the sub-transistors of a transistor are electrically connected together, and all the drains of the sub-transistors of a transistor are electrically connected together. Accordingly, said interconnected sub-transistors thus behave like the corresponding large transistor. Thus, the larger transistor pair is replaced with n pairs of smaller sub-transistors.

These pairs of sub-transistors can be distributed on the substrate, but the distance between two sub-transistors of the same pair must be as small as possible, and preferably must tend to W/n.

Hence, the overall surface of the large transistors of the pair is still W×L, and the effect of random components is kept low. Furthermore, the distance between the large transistors of the pair corresponds to the mean distance between adjoining sub-transistors. Accordingly, the mean distance between the large transistors of the pair tends to W/n. As a consequence, the contribution of channel silicon thickness variation to overall threshold voltage variability is reduced.

For instance, each transistor of a pair has a channel surface of 1 µm², with $L_G=W_G=1$ µm. According to the example illustrated on FIG. 13, channel silicon thickness fluctuations induce a threshold voltage variability of about 5 mV, while random components induce a threshold voltage variability of about 1 mV, for an overall threshold voltage variability of 5.1 mV.

By providing a pair of transistors wherein each transistor is constituted by 10 sub-transistors, each of said sub-transistors having a channel length $L_i$ of 1 µm and a channel width $W_i$ of 1.0 µm, then the overall channel surface of each transistor is still 1 µm², corresponding to a random variability $\sigma\Delta V_{TR}$ of 1 mV, but the mean distance between the two transistors of the pair is lowered down to 0.1 µm, corresponding to a channel silicon thickness induced variability $\sigma\Delta V_{TSi}$ of 0.2 mV.

According to equation 1, the overall variability is thus reduced to 1.2 mV:

$$\sqrt{0.2^2 + 1^2} \approx 1.2$$

As shown by this example, a large number of sub-transistors allows for a significant reduction of the threshold voltage variability. However, realizing a great number of sub-transistors can be difficult to achieve, whereas a low threshold variability may not be required.

The minimum number and size of the sub-transistors can be determined by the following method to achieve a desired overall variability, while having the fewer possible sub-transistors:

a) defining a desired overall threshold voltage variability $\sigma_{\Delta V_T}$, b) determining values of random threshold voltage variability $\sigma_{\Delta V_{TR}}$ and channel silicon thickness induced threshold voltage variability $\sigma_{\Delta V_{TSi}}$ permitting said desired overall threshold voltage variability $\sigma_{\Delta V_T}$ to be achieved, c) determining values of overall transistor channel surfaces and sub-transistor channel surfaces permitting to obtain the values determined at step b), d) determining the numbers of sub-transistors required to achieve the values determined at step c), e) selecting a number of sub-transistors close to the minimum of required sub-transistors, thereby determining the corresponding value of the total transistor surface.

Preferably, the channel surface of a transistor and the number of sub-transistors are determined to achieve an overall threshold voltage variability $\sigma_{\Delta V_T}$ corresponding to $$\sigma_{\Delta V_T} = \sqrt{\sigma_{\Delta V_{TR}}^2 + \sigma_{\Delta V_{TSi}}^2}$$

Figure 14:
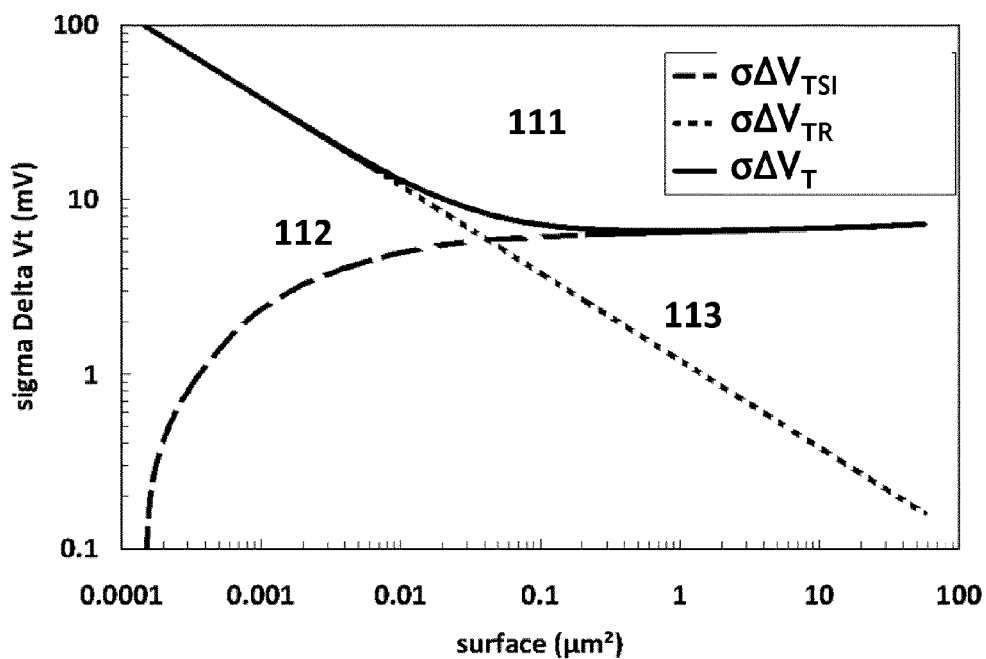

As another non-limiting example for illustrating the method, in a similar way to FIG. 13, the graph of FIG. 14 illustrates curves representing, as a function of the transistor surface in a logarithmic scale, possible values of threshold voltage overall variability $\sigma\Delta V_T$ (solid line 111) and its main components, i.e. channel silicon thickness induced variability $\sigma\Delta V_{TSi}$ (dashed line 112) and random variability $\sigma\Delta V_{TR}$ (dotted line 113). FIG. 14 is a simplified model used to illustrate the principles of the invention.

The pairs of random threshold voltage variability and channel silicon thickness induced threshold voltage variability, i.e. ($\sigma\Delta V_{tr}$; $\sigma V_{TSi}$) which allow for the desired overall threshold voltage variability $\sigma_{\Delta V_T}$ to be obtained is first determined.

As an example, FIG. 15 illustrates such a set of pairs (dashed line 104) which allow for an overall threshold voltage variability of 3 mV to be achieved, with the example of FIG. 14.

FIG. 16 illustrates a dashed line 105 representing the set of pairs of overall surfaces and sub-transistors surfaces which allow achieving the result of FIG. 15, and a dotted line 106 representing the number of sub-transistors required for the obtained pairs illustrated by the dashed line 105.

In this example, the dotted line 106, representing the required number of sub-transistors, shows a minimum for an overall surface of around 0.25 µm². According to the dashed line 105, an overall surface of 0.25 µm² corresponds to sub-transistor surfaces of about 600 nm². As a result, around 417 sub-transistors of 600 nm² are required for each transistor in order to achieve an overall threshold variability of 3 mV.

The effect of the invention can even be improved by keeping the channel silicon thickness induced variability $\sigma V_{TSi}$ at a low level for sub-transistor surfaces.

With a prior art manufacturing method, the channel silicon thickness induced variability $\sigma V_{TSi}$ must be kept low for the large surface of the transistor (typically above 0.5 µm²), which is difficult.

According to the invention, the channel silicon thickness induced variability $\sigma V_{TSi}$ must only be kept relatively low for sub-transistor surfaces which are much smaller than the large transistor surfaces and thus much easier to achieve.

The invention claimed is:

1. A pair of transistors on a substrate having a buried interface which delimits the active region thickness of the channel of said transistors, said transistors having each:
   a transistor channel length $L_G$,
   a transistor channel width $W_G$,
   a transistor channel surface S, said transistor channel surface S being greater than or equal to 0.5 µm²,
   wherein each transistor of said transistor pair is made of several sub-transistors,
   wherein each sub-transistor of a transistor has a sub-transistor channel length $L_i$ and has a sub-transistor channel width $W_i$, said sub-transistor channel length $L_i$ being substantially equal to the transistor channel length $L_G$, and said sub-transistor channel width $W_i$ being smaller than the transistor channel width $W_G$, so that the sum of the sub-transistor channel widths $W_i$ of the sub-transistors of a transistor is substantially equal to the channel width $W_G$ of said transistor,
   wherein the sub-transistor channel width $W_i$ is also smaller than the sub-transistor channel length $L_i$, and
   wherein each sub-transistor of a transistor of said transistor pair is spaced apart from at least one adjoining sub-transistor of the other transistor of said transistor pair by a distance D less than half the transistor channel width $W_G$, said distance D between two sub-transistors being measured between the respective center of the channels of said sub-transistors, wherein said sub-transistor of a transistor and said adjoining sub-transistor of the other transistor are aligned in the direction of their widths.

2. The pair of transistors according to claim 1, wherein said distance D is less than 1 µm, preferably less than 0.1 µm.

3. The pair of transistors according to claim 1, wherein said distance D is less $W_G/4$, preferably less than $W_G/10$.

4. The pair of transistors according to claim 1, wherein each transistor of said transistor pair comprising at least 3 sub-transistors, preferably at least 10 sub-transistors, more preferably 100 sub-transistors.

5. The pair of transistors according to claim 1, wherein said transistor channel length $L_G$ is greater than or equal to 0.25 µm, preferably than or equal to 0.5 µm.

6. The pair of transistors according to claim 1, wherein said transistor channel surface S is greater than or equal to 2 µm², preferably greater than or equal to 5 µm².

7. The pair of transistors according to claim 1, wherein the substrate is a silicon-on-insulator substrate.

8. The pair of transistors according to claim 1, wherein the substrate is a bulk substrate wherein a silicon film constituting the channel is isolated with a doped layer.

9. The pair of transistors according to claim 1, wherein the two transistors of the transistor pair are made of the same number of sub-transistors.

10. The pair of transistors according to claim 1, wherein the sub-transistors have the same width $W_i$.

11. An integrated circuit having at least one pair of transistors according to claim 1.

12. A method for manufacturing pairs of transistors according to claim 1, on a substrate having a buried interface which delimits the active region thickness of the channel of said transistors, said transistor pairs having:
   a random threshold voltage variability $\sigma_{\Delta VTR}$ which depends on the channel surface of the transistors,
   a channel silicon thickness induced threshold voltage variability $\sigma_{\Delta VTsi}$ which depends on the transistors respective location on the substrate,
   wherein each transistor of a transistor pair is made of several sub-transistors,
   and each of the sub-transistors of a transistor adjoining a sub-transistor of the other transistor of said transistor pair so that the transistors respective location depends on the number of sub-transistors, said method comprising
   a) defining a desired overall threshold voltage variability $\sigma_{\Delta VT}$,
   b) determining values of random threshold voltage variability $\sigma_{\Delta VTsi}$ and channel silicon thickness induced threshold voltage variability $\sigma_{\Delta VTsi}$ permitting said desired overall threshold voltage variability $\sigma_{\Delta VT}$ to be achieved,
   c) determining values of overall transistor channel surfaces and sub-transistor channel surfaces permitting to obtain the values determined at step b),
   d) determining the numbers of sub-transistors required to achieve the values determined at step c),
   e) selecting a number of sub-transistors close to the minimum of required sub-transistors, thereby determining the corresponding value of the total transistor surface;
   and then manufacturing pairs of transistors having said number of sub-transistors.

* * * * *